United States Patent [19]

Vermilyea

[11] Patent Number: 4,509,030
[45] Date of Patent: Apr. 2, 1985

[54] CORRECTION COIL ASSEMBLY FOR NMR MAGNETS

[75] Inventor: Mark E. Vermilyea, Schenectady, N.Y.

[73] Assignee: General Electric Company, Schenectady, N.Y.

[21] Appl. No.: 628,076

[22] Filed: Jul. 5, 1984

[51] Int. Cl.³ .............................................. H01F 7/22
[52] U.S. Cl. .................................... 335/216; 335/299; 324/320
[58] Field of Search ................ 335/216, 299; 376/142, 376/146; 324/318, 319, 320, 322

[56] References Cited

U.S. PATENT DOCUMENTS

| | | | |
|---|---|---|---|
| 3,185,900 | 5/1965 | Jaccarino et al. | 335/216 |
| 3,469,180 | 9/1969 | Anderson | 324/320 |
| 3,577,067 | 5/1971 | Weaver | 324/320 |
| 4,363,981 | 12/1982 | Laskaris | |
| 4,456,881 | 6/1984 | Compton | 324/319 |

Primary Examiner—George Harris
Attorney, Agent, or Firm—Lawrence D. Cutter; James C. Davis, Jr.; Marvin Snyder

[57] ABSTRACT

An NMR magnet correction coil comprises a plurality of cylindrical coil forms coaxially disposed with radially exterior coil forms possessing saddle coils so as to provide slits in the exterior forms. The outermost coil form is wrapped with a non-magnetic wire in order to keep the forms in a fixed relationship. If three or more coil forms are employed, the inner forms are wrapped with a band of material which also serves to provide a spiral flowpath for cryogens such as liquid helium. A pair of keys is provided for tieoff and insulation of the outer wire band, as well as for positioning of the entire assembly.

13 Claims, 9 Drawing Figures

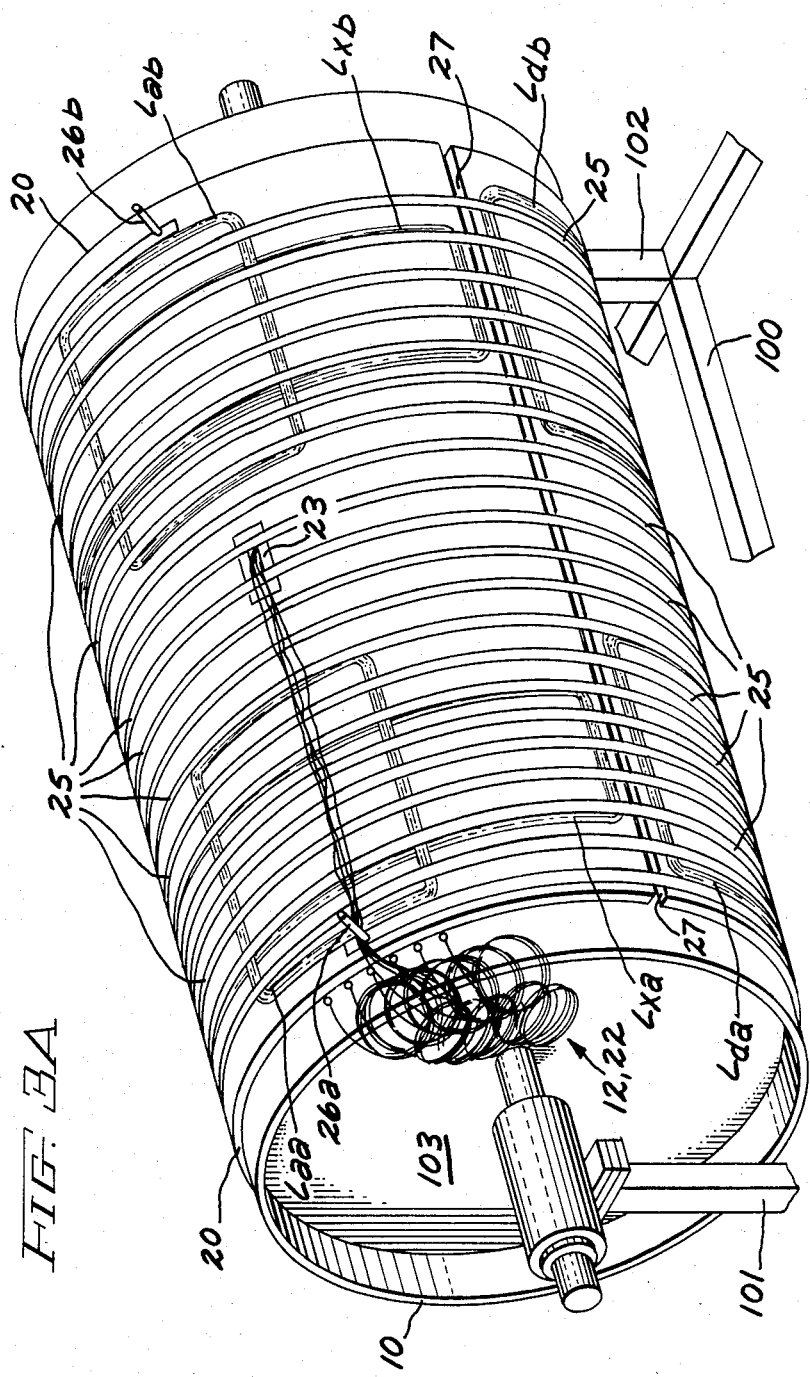

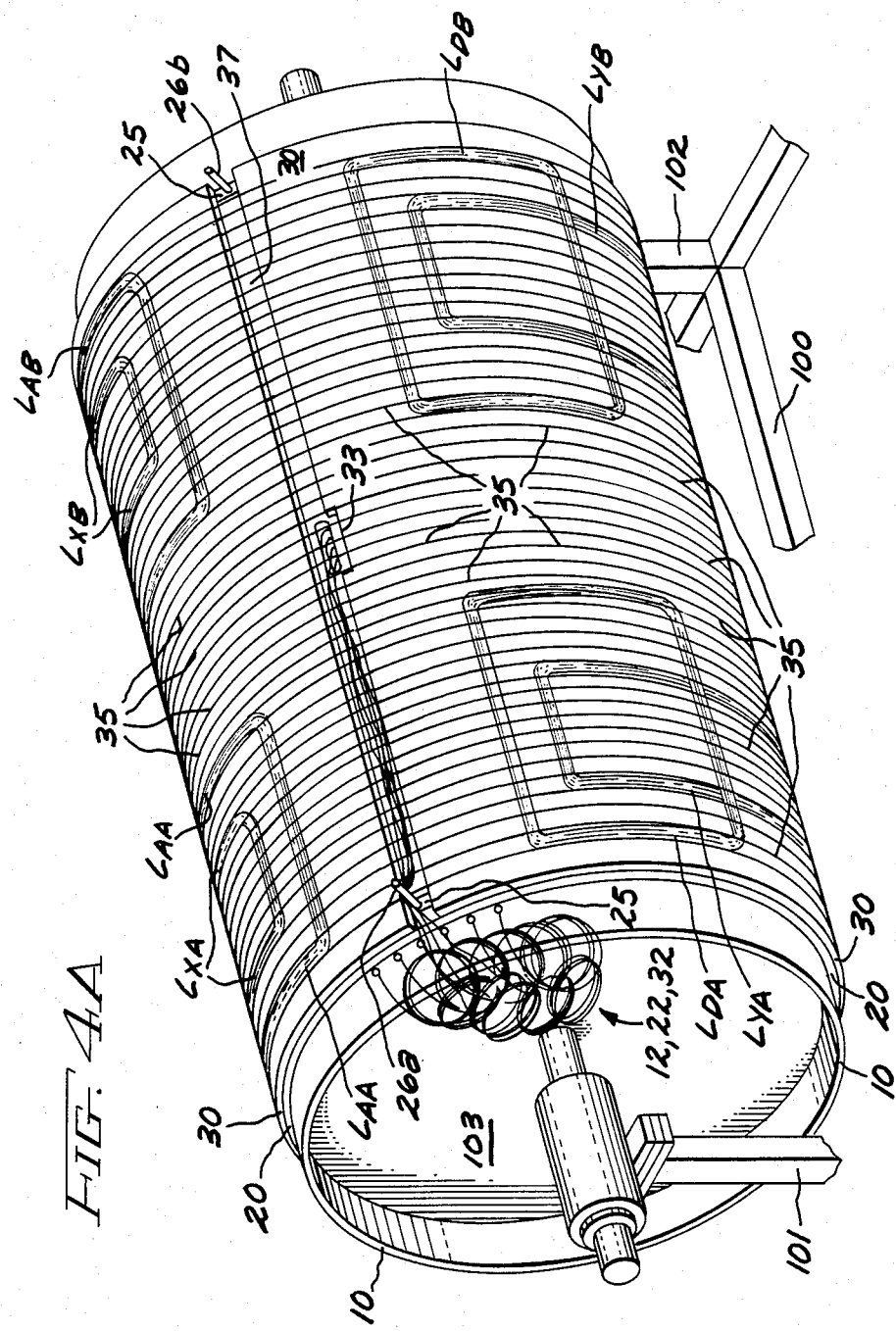

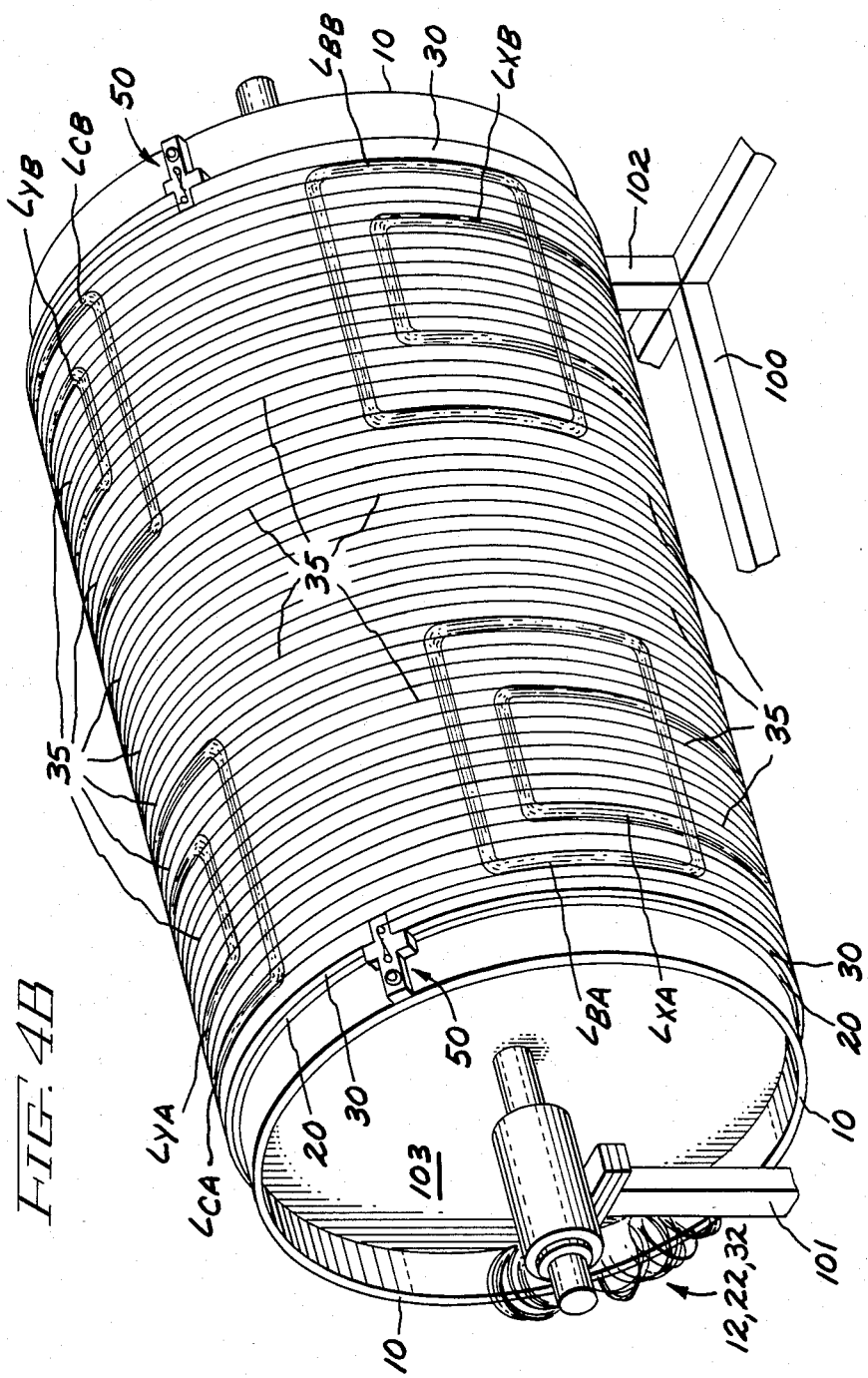

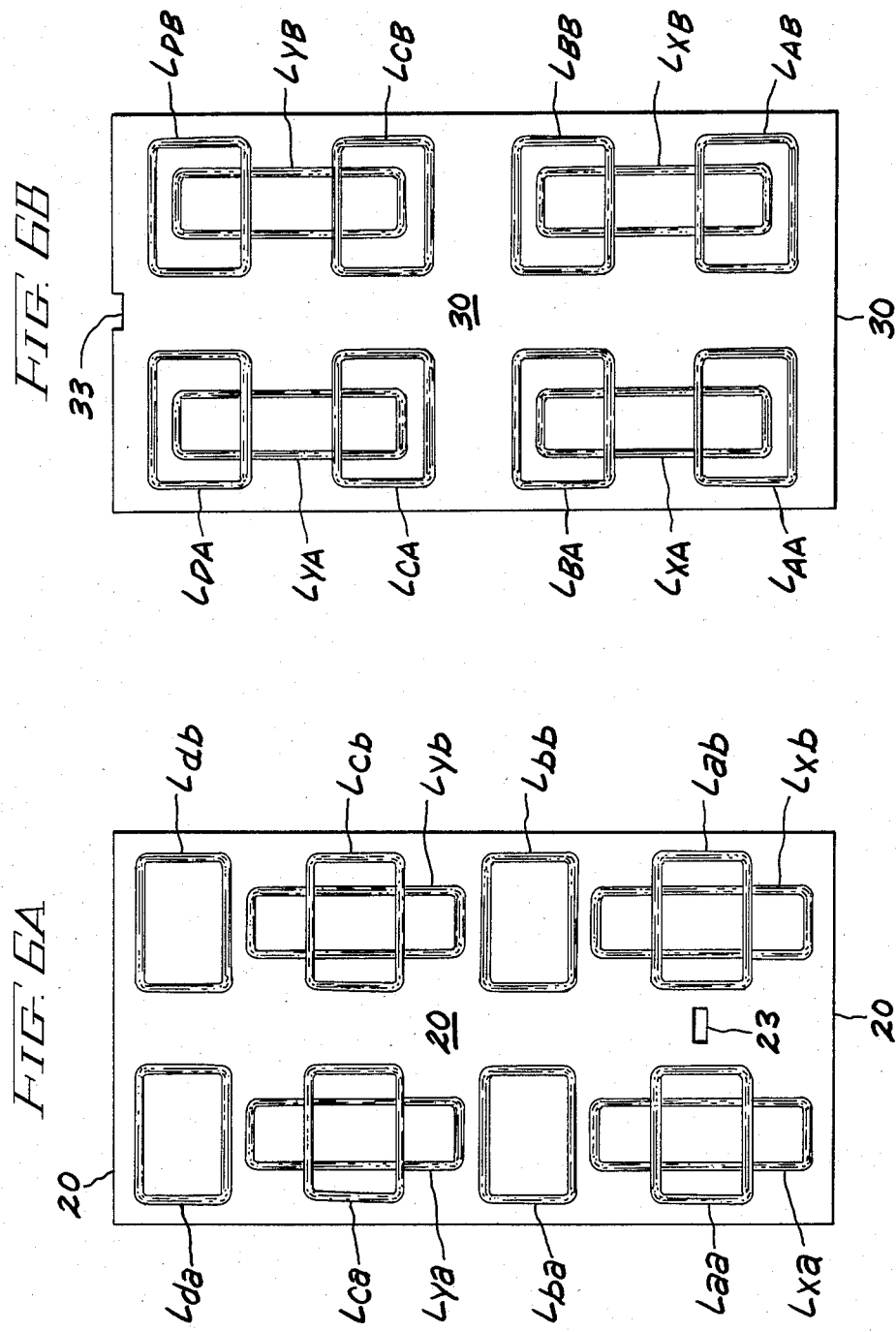

CORRECTION COIL ASSEMBLY FOR NMR MAGNETS

BACKGROUND OF THE DISCLOSURE

The present invention relates to correction coils employable in nuclear magnetic resonance (NMR) imaging systems. More particularly, the present invention relates to a coil assembly including axial and transverse magnetic field correction coils which are configured in an assembly which prevents relative motion between the coils even at cryogenic temperatures while allowing accurate positioning of the coils as a unit.

In NMR imaging systems, particularly those employed for medical diagnostic purposes, it is necessary to provide a highly uniform and high strength magnetic field. Superconducting magnet coils provide a desirable method for achieving such a field. Superconducting magnets offer a particular advantage in that once energized, no electrical power is needed to maintain the resulting magnetic field. However, NMR imaging imposes strict requirements upon the magnetic field uniformity. In order to reduce the presence of image artifacts, magnetic fields exhibiting spatial variations of only a few parts per million are desired. However, even slight manufacturing variations in the construction of the main magnet can adversely effect magnetic field uniformity. Accordingly, correction coils are generally required to provide corrective magnetic field components. Typically the correction coils carry much less current than do the main magnet coils. Adjustments to the main field provided by correction coils are typically achieved by selecting appropriate current levels and current polarities for the correction coils. In general, correction coils comprise coils or coil sets which are either axisymmetric or axiperiodic. Axisymmetric correction coils typically comprise coil loops which completely surround a cylindrical support form in the circumferential direction. These coils are particularly desirable in adjusting certain axial gradients of the magnetic field. On the other hand, axiperiodic coils are typically configured as arcuate segments joined by axial segments and are commonly referred to as saddle coils. These coils are provided to correct other axial components of the magnetic field within the cylindrical volume. However, of course, the spatial distribution associated with the axial coil corrections and those associated with the saddle coil corrections are significantly different.

Since axial correction coils completely surround the cylindrical coil form upon which they are disposed, it is not possible to employ coil forms with axial slots which extend completely through the form. However, appropriate choices for transverse or saddle shaped correction coils are seen herein as being capable of providing an opportunity for constructing coils with slotted forms.

The reasons which motivate the use of superconductive main magnet coils also provide motivation for the construction of superconductive correction coils. While it is be desirable to include axial and transverse correction coils on a single form, the wiring patterns are generally too complicated to manufacture on a single form to the precision required. Accordingly, multiple forms are employed. However, it must be borne in mind that the electrical conductors preferably comprise superconductive material and accordingly should be cooled to cryogenic temperatures during operation. Therefore, it is preferable to have all of the windings in as close contact as possible with cryogenic coolants such as liquid helium. Such assemblies are operated at temperatures of approximately 4.2° K. The intimate cryogenic fluid contact with the coils is advantageous in preventing and/or minimizing the effects of quench conditions. However, as indicated above, there are stringent requirements with respect to manufacturing tolerances. The correction coils must not only be disposed on their respective forms in fixed positions which prevent conductor motion, but the assembly of distinct coil forms must also be held together in a fashion which prevents relative motion between inner, middle and outer coil forms. The correction coil sets must therefore be accurately positioned with respect to one another and also with respect to the main coils themselves. This insures that the geometric center for each coil set is known. This is a necessity for field corrections. Furthermore, in the case of multiple coil forms, the assembly must be configured so that the outer forms do not lock against one another thereby permitting motion of the inner coil form. It is therefore seen that it is necessary to simultaneously achieve intimate contact between the correction coil conductors and the coolant fluid while at the same time insuring that relative motion between the coils forms is prevented. It must be further borne in mind that these requirements must be met for a coil assembly which is manufactured under room temperature conditions but which is to be immersed in a cryogenic fluid.

SUMMARY OF THE INVENTION

In a preferred embodiment of the present invention a correction coil assembly for NMR magnets comprises a set of three epoxy/glass fiber cylindrical coil forms disposed coaxially with respect to one another. Axisymmetric coils are disposed on the inner form while radially exterior forms are slotted and include transverse or saddle shaped coil structures. All coil forms, save the innermost one, are slotted. The first (radially innermost) slotted coil form is expanded and slipped over the axial coil form and is affixed thereto by means of a non-magnetic band which is tightly wrapped around the slotted coil form to securely hold it against the first form. The band possesses a coefficient of thermal expansion which is greater than that of the material comprising the first (unslotted) coil form. The banding tensile strength and attachment considerations may be effectively eliminated however because pins which temporarily hold the banding in place can be removed and their function supplanted by the presence of one or more overlying coil forms. Therefore, the tensile strength of the banding must also be considered since it is subject to greater stress under cryogenic conditions than during manufacture and assembly at room temperature conditions. In the preferred embodiment of the present invention a third coil form including saddle coils is also included. This latter coil form comprises the second slotted coil form employed. In this embodiment, the radially innermost slotted coil form is held against the axial coil form by means of the above-mentioned band which is wrapped around the outer portion of the first slotted form. The second slotted form is then slid over the banded structure and is itself further banded with a wire wrapping which preferably comprises a material which has the same thermal and mechanical properties as the superconductive material included in the coils on the forms. The temporary pins holding the inner banding may then be removed as the function of the banding has been supplanted by the overlying form. The innermost coil form is axially longer than either of the two slotted coil forms which bear the saddle coils. Accordingly, this additional length provides room for the inclusion of a key assembly which acts to align the coil forms in both an axial and a circumferential direction. Furthermore, this key provides means for alignment of the completed correction coil assembly with respect to the main magnet coils themselves. Another object of the invention which is achieved by the present correction coil is the formation of a structure which is relatively thin in the radial direction. In this regard, it should be borne in mind that the assembly of the present invention is to be inserted in a cryogenic vessel. In order to minimize the volume of cryogenic liquid employed, it is therefore seen that the "buildout" in the radial direction should be as small as possible. The reasons for not being able to achieve such a small buildout using a single coil form have already been considered.

Accordingly, it is an object of the present invention to provide a correction coil assembly which is particularly useful in cryogenic environments.

It is a further object of the present invention to provide correction coils for NMR medical diagnostic imaging systems.

It is another object of the present invention to provide a correction coil assembly in which relative motion between coil forms is prevented.

It is yet another object of the present invention to provide a magnetic field correction coil assembly for a superconductive magnet in which there is provided a large degree of contact between the correction coils and the cryogenic fluid.

Lastly, but not limited thereto, it is an object of the present invention to provide a correction coil assembly which is readily alignable both in manufacture and during installation in a cryostat.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 3A illustrates a transverse coil form in place over an axial coil form and further illustrates the use of flat banding material to hold the transverse coil form against the axial coil form;

FIG. 4A illustrates the structure shown in FIG. 3A with the addition of a second slotted coil form together with a final layer of wire wrapping to hold the entire structure together;

FIG. 4B illustrates the same structure as shown in FIG. 4A except that it is rotated through an angle of approximately 180°;

FIG. 6A is a schematic view illustrating, in a developed format, the transverse coil winding pattern employed on the first slotted coil form; and FIG. 6B is a schematic view illustrating, in developed format, transverse coilwinding pattern employed on the second slotted coil form.

DETAILED DESCRIPTION OF THE INVENTION

The present invention is illustrated in the Figures described above. These Figures illustrate a particular embodiment of the present invention. However, it should be understood that its applicability extends to general coil configurations and not only to those coil configurations shown herein for purposes of illustration comprehension and completeness. More particularly, other arrangements of axial and transverse saddle coils may be provided.

Figure 1:
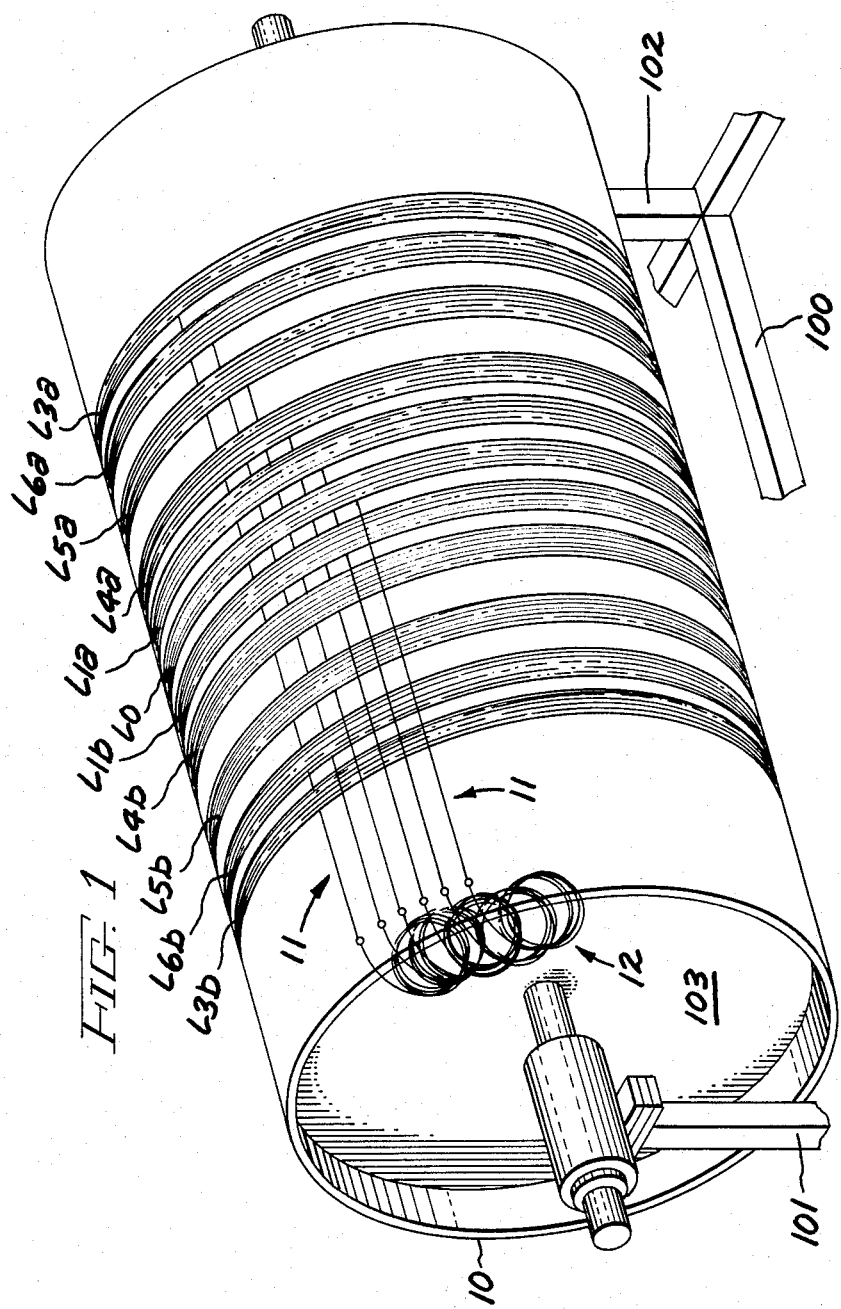
FIG. 1 is an isometric view of an axial coil set and coil form employed in the assembly of the present invention.

FIG. 1 illustrates a typical innermost (axial) coil and coil form employed in the assembly of the present invention. In particular, axial coils $L_0$, $L_{1a}$, $L_{4a}$, $L_{5a}$, $L_{6a}$, $L_{3a}$, $L_{1b}$, $L_{4b}$, $L_{5b}$, $L_{6b}$ and $L_{3b}$, are shown. The particular coil designations do not have any direct relevance to the present invention and are provided merely for convenience. These coils are axial coils and are mounted on coil form 10 which preferably comprises a composite of epoxy and glass fiber material. Coil form 10 is mounted on mandrel 103 which is supported by stand 100 having vertical end members 101 and 102, as shown. One of the most important aspects to note in FIG. 1 is that it would not be possible to incorporate an axial slit in coil form 10. If such a slit were present, the axial coils shown would not be held in a rigid condition. Since these coils preferably comprise superconductive material, it is important that relative motion between the conductors or between the conductors and the coil form not be permitted. Such motion creates friction which produces heat which increases the risk of localized quench conditions.

Figure 2:
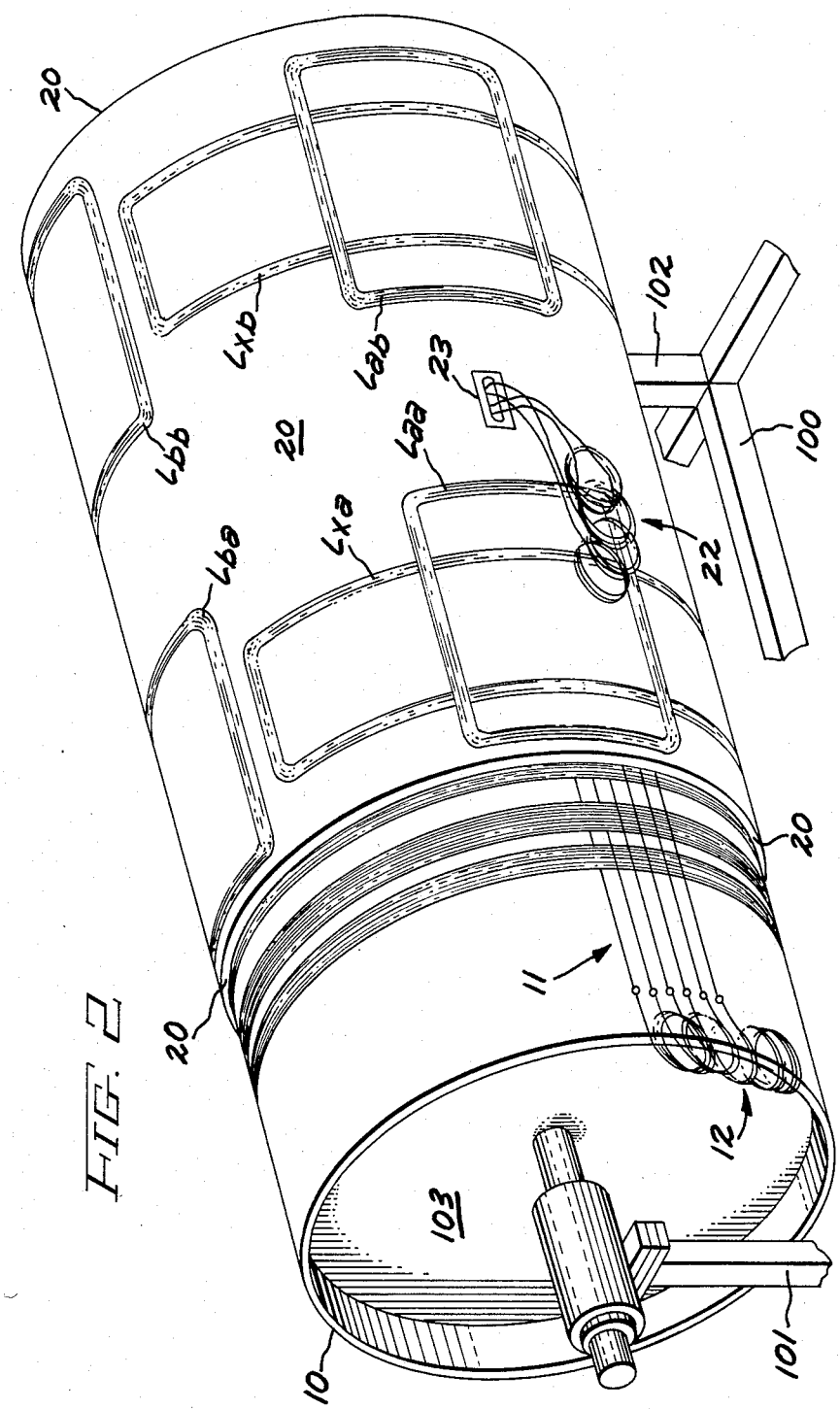
FIG. 2 illustrates a transverse coil form in the process of being slipped over the axial coil form of FIG. 1.

However, correction of magnetic field nonuniformities generally requires more than the kind of correction which can be provided by axial coils alone. More particularly, saddle coils are required. It is important to realize that the selection of correction coils for NMR imaging systems is not a straight forward matter. The proper design of transverse coils dictates that the coil patterns exhibit certain circumferential periodicities. Fortunately, coil patterns and periodicities have been found such that certain sets of transverse coils can be laid out on the same coil form so that an axial slit is permitted. These coils are therefore seen as having the advantage that, even though placed on a cylindrical coil form, an axial slit may nonetheless be provided in this form without the necessity of correction coil conductors crossing the slit or gap. Furthermore, because of the complexity of the coils and the desire to align them properly with respect to one another various correction coil sets are required to be disposed on distinct, but aligned, coil forms. Accordingly, FIG. 2 illustrates first transverse coil form 20 with slot 27 therein (see FIG. 3A) in the process of being slipped over coil form 10 on which the axial windings are disposed. The transverse or saddle coils are in contrast disposed on coil form 20. Slit 27 enables form 20 to be spread slightly and slipped over coil form 10. However, as is indicated below, the restoring force associated with this spreading operation is not sufficient to hold the assembly together.

FIG. 2 particularly shows transverse coils $L_{aa}$, $L_{ba}$, $L_{ab}$, $L_{bb}$, $L_{xa}$ and $L_{xb}$ (see below for a discussion of the coil labelling scheme). All of the coils on form 20 include connecting leads (not shown) connecting all coils subtending the same circumferential angle and disposed on the same axial end of the form to one another (so as to act as coil sets) and to exterior terminal connection port 23. Furthermore FIG. 2 illustrates that coil leads 11 from the axial coils extend along coil form 10 in an axial direction and terminate in temporary cable bundling 12. Likewise conductors from connection port 23 terminate in a temporary cabling bundle 22. Again it should be noted that the conductors in the axial and transverse coils shown in the Figures in the present invention preferably comprise superconductive material. The same holds true for the conductors in bundles 12 and 22.

FIG. 3A illustrates the same configuration shown in FIG. 2 with several exceptions. Firstly, coil form 20, which is preferably shorter in length than coil form 10, is now shown in its final position, the form having been spread at slot 27 and slipped over coil form 10. Secondly, the structure shown in FIG. 3A has been slightly rotated in a counterclockwise direction so as to provide a view of slot 27. As indicated above, it is seen that the saddle coils are disposed so as not to cross axial slot 27. Thirdly, the assembled structure is shown wrapped with banding material 25 which is preferably, wrapped in a spiral pattern. Banding 25 is preferably affixed at either end thereof with temporary holding pins 26a and 26b. These pins are temporary in that they may be removed at a later point in assembly without loss of structural rigidity. Banding material 25 preferably comprises a non-magnetic material such as aluminum. Furthermore, since the glass fiber forms shrink much less than most metals under cryogenic conditions, metal banding material 25 should exhibit sufficient tensile strength. Furthermore, the design of the banding structure is complicated by the fact that each axially slit (saddle coil) form must be banded independently to avoid frictional locking together or two forms and consequent looseness from base form 10. Metal banding is preferred over a glass fiber band because of its low cost, availability and ease of application and disassembly. In any event metals employed for such banding purposes must be non-magnetic, because of the environment in which it is to be employed. The flat band structure also provides an advantage in that it results in a very small radially outward build. Again as pointed out above this minimizes coil form volume and correspondingly the volume of cryogenic fluid used for cooling the superconductive windings.

It is also seen that two additional transverse coils $L_{da}$, and $L_{db}$ are now visible in FIG. 3A (in comparison with FIG. 2). A more thorough understanding of the transverse coil winding pattern is best had from an examination of FIGS. 6A and 6B below. Furthermore, the discussion below with respect to these figures also provides an appropriate description of the coil naming (subscripting) scheme employed herein.

Figure 3B:
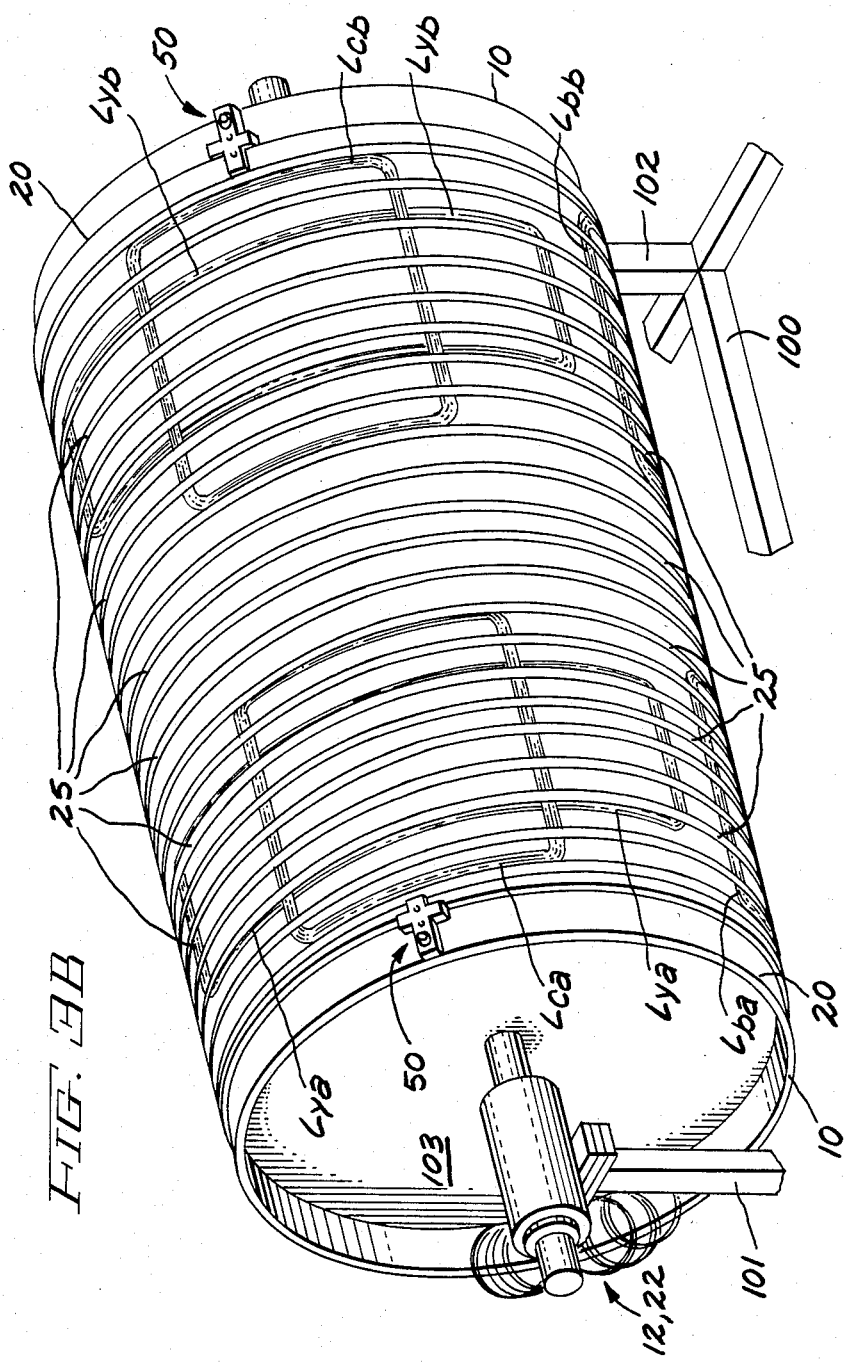
FIG. 3B illustrates the same structure as shown in FIG. 3A except that it is rotated through an angle of approximately 180°.

FIG. 3B provides an isometric view of the same structure shown in FIG. 3A except that the structure is rotated in a counterclockwise direction through an angle of approximately 180°. Accordingly, coils $L_{ya}$, $L_{ca}$, $L_{yb}$, and $L_{cb}$ are now visible. It is also important to note the presence of key assembly 50 shown in FIG. 3B. Key assembly 50 provides means for aligning coil forms 10 and 20 in both axial and circumferential directions. Additionally, key assembly 50 also provides an alignment mechanism which is of use when the correction coil assembly is inserted into the cryostat with the main magnet coils. This key assembly is therefore seen to be useful in providing an earth based referenced frame for the correction coil assembly. This alignment is crucial in matching the action of the correction coils with any inherent inhomogeneity in the main magnet coils. A more detailed view of key assembly 50 is provided in FIG. 5, which is discussed below.

FIG. 4A illustrates, by way of example, a finally assembled correction coil in accordance with a preferred embodiment of the present invention. In particular, a second transverse correction coil form 30, with its own slot 37, has been slipped over coil forms 10 and 20. Slot 37 in coil form 30 is aligned with connection port 23 in coil form 20 and disposed so that temporary pins 26a and 26b extend through the slot 37. Additionally, coil form 30 is provided with notch 33 to accommodate connection port 23. Note also that the cabling from port 23 together with the cabling associated with the saddle coils on form 30 are disposed in slot 37. Accordingly, FIG. 4A illustrates the presence of temporary cabling bundles 12, 22 and 32. Also visible through slot 37 is banding 25.

Lastly, and importantly, it is to be noted that the radially outermost coil form (30 here) is wrapped with a wire material. In the present invention this material preferably comprises the same superconductive wire employed in the correction coils themselves. This final banding must be tied off without inducing stress concentrations high enough to break it upon cooling. The material selected for this final banding is imporant. A high ratio of strength to thermal contraction is desired. Additionally, non-magnetic material must be employed. An excellent non-magnetic material which is available for these purposes is the very superconductor with which the coils are wound that is, a Niobium-Titanium superconductor matrix which includes a ratio of copper to superconductor of 2:1. For such a material its contraction from 300° K. to 4.2° K. is only about 2.9 mils per inch, compared to 4.4 mils per inch for aluminum. However, its yield stress has been measured at 55,000 psi, compared to 40,000 psi for aluminum. However, the circumferential direction of the inner coil form is only about 2.2 mils per inch so that the thermal stress induced in the banding is approximately 10,000 psi which is comfortably below the yield stress of either material. Round wire banding 35 is preferably chosen since it is easy to tie off the material without inducing stress concentrations which are high enough to break it upon cooling. Tieoff points are provided at key assemblies 50 as more particularly described in FIG. 5. Additionally, wire banding 35 is desirable since it can be tied off without increasing the radial build problem discussed above. This ensures a final assembly which is relatively thin.

Additionally, FIG. 4A illustrates the presence of a second set of transverse correction coils, namely coils $L_{YA}$, $L_{DA}$, $L_{AA}$, $L_{XA}$, $L_{YB}$, $L_{DB}$, $L_{AB}$, and $L_{XB}$. Note that the subscripts designating the different coils on coil form 30 are all capital letters. This helps to distinguish these transverse coils from the transverse coils mounted on coil form 20. Also, if one considers symmetry with respect to a central plane (not shown) which is perpendicular to the cylindrical axis one finds that the transverse coils on one side of this plane of symmetry possess second subscripts designated "A" while transverse coils disposed on the opposite side of this plane possess second subscripts designated "B". Similarly with respect to the transverse coils disposed on coil form 20 (FIGS. 3A and 3B) the corresponding transverse coils possess subscripts "a" or "b", also depending upon which side of this plane they are disposed. Additionally the elongate rectangular coils include a subscript designation in which the first letter of the subscript is either "x" or "y" (on coil form 20) or "X" or "Y" (on coil form 30). The saddle coils which more closely approximate a square are designated with subscripts whose first letter is either "a", "b", "c", or "d" (on coil form 20) or "A", "B", "C", or "D" (on coil form 30). It is thus seen that all of the transverse coils are designated by wholly alphameric subscripts, while the axial coils shown in FIG. 1 include subscripts in which the first character is always numeric. In this way all of the coils employed in the embodiment illustrated herein are readily distinguished and located. It should be understood however that connections between pairs of transverse coils do not necessarily follow from the labeling scheme described. For example, on coil form 20, coils $L_{ab}$, $L_{bb}$, $L_{cb}$ and $L_{db}$ are connected in series with appropriate winding polarities. $L_{xb}$ and $L_{yb}$ are similarly connected to form a distinct transverse correction coil set. The same pattern also holds for the other transverse coils shown. See also the discussion below with rspect to FIGS. 6A and 6B.

It is also seen that FIG. 4B illustrates the same structure as shown in FIG. 4A except that the entire structure is rotated in a counterclockwise direction through an angle of approximately 180°. Also more particularly visible in FIG. 4B are key assemblies 50 which particularly illustrate the final wire wrap 35 which is tied off to these keys.

Figure 5:
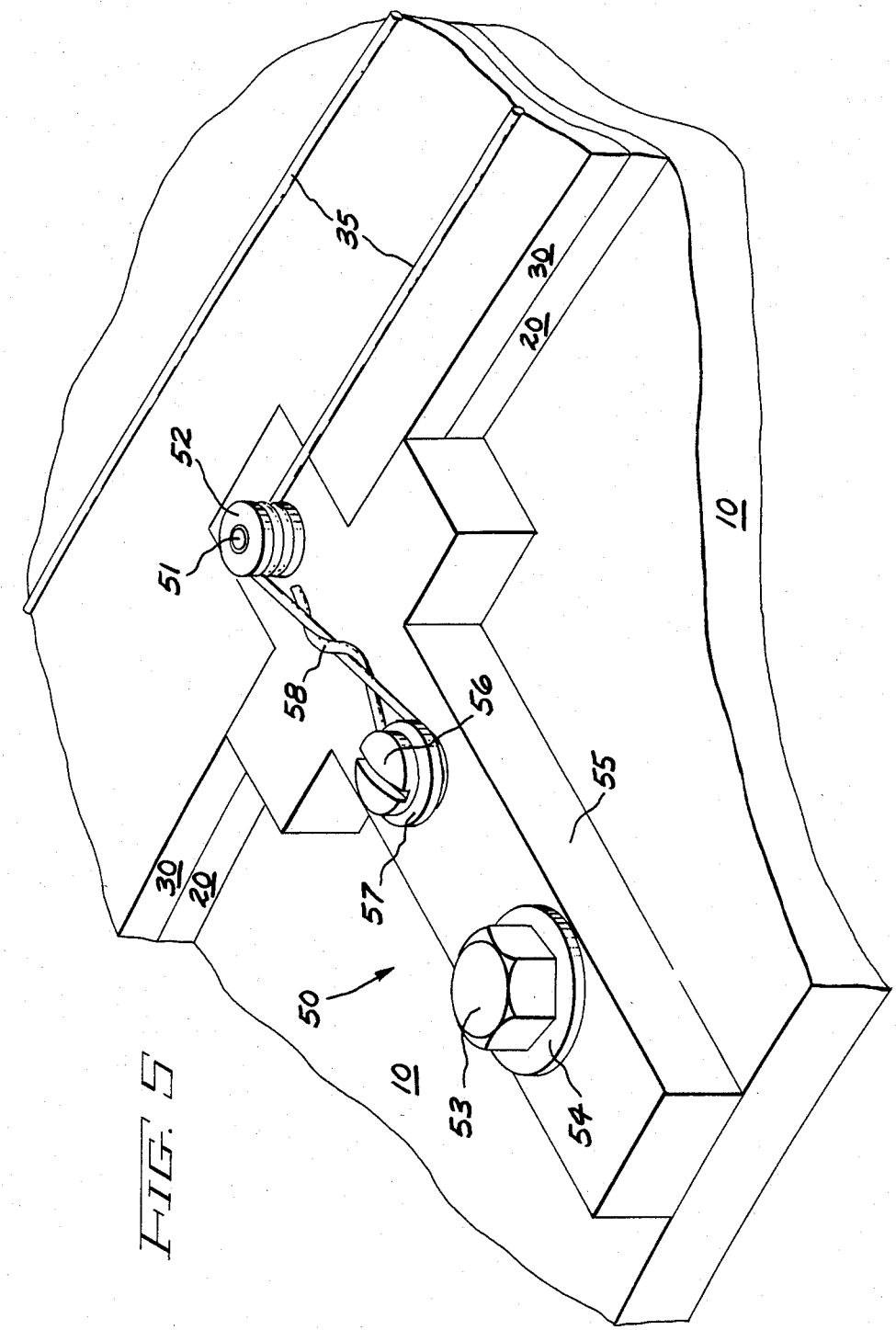
FIG. 5 is an isometric view particularly illustrating the alignment keyway structure of the present invention.

The structure of the keys is more particularly illustrated in FIG. 5. In particular, key 55 is shown bolted to the axially extending portion of coil form 10 by means of bolt 53 and washer 54. Key 55 comprises a non-magnetic material such as aluminum or a glass fiber composite material. Key 55 is preferably in the form of a cross the top of which extends axially into notches in coil forms 20 and 30, as shown. Round wire banding 35 is wrapped several times around insulative screw 52 which is affixed to key 55 by means of screw 51. Bushing 52 provides a desired degree of stress relief for the wire banding. Wire banding 35 is further wrapped around insulative binding post 57 which is affixed to key 55 by means of screw 56. Additionally, it is desirable to include Belleville washers on screw 56 to ensure clamping power even under cryogenic conditions. All screws, bolts, bushings, binding posts and washers shown in FIG. 5 comprise non-magnetic material. Additionally key 55 may also be glued to form 10 for additional strength. In order to tie off wire banding 35, any insulation on the end of the wire is stripped off and the tie off wrap 58 is soldered. Furthermore, a coating of glue is preferably applied to the solder joint in order to ensure that wire band 35 is not electrically connected in any way to key 55, particularly if it comprises aluminum. This insulating function is very important since the keys are used to align the assembly within the cryostat. Accordingly, key 55 would be in contact with the metal cryostat vessel. Accordingly, a closed circuit path could be formed which would include wire banding 35. Such a situation is highly undesirable.

FIGS. 6A and 6B are provided to indicate several possible forms of transverse coil winding patterns. They are also provided to indicate the relative orientations of the coil forms shown in FIGS. 3A, 3B, 4A and 4B. FIGS. 6A and 6B also provide an opportunity to view the layout of all of the transverse coil forms at one time. The scheme for coil labeling has already been indicated above.

While the structure shown in FIGS. 4A and 4B illustrate preferred embodiments of the present invention in which two sets of transverse correction coils are employed, it is also possible to employ only a single transverse coil form. In the case of a single transverse form, coil form 20 and its associated coils along with aluminum banding 25 are not employed. Instead, the radially outermost coil form 30 is directly disposed around coil form 10 with the outermost banding comprising wire wrap 35 as described above. In this case banding 25 is not required since split coil form 20 is not present. However, if desirable, such banding is employed in order to provide a spiral coolant flowpath between the coil forms. Such a configuration provides greater protection against quenching. In the case of multiple transverse coil forms, one preferably employs a flat band between every pair of transverse coil forms.

From the above, it should be appreciated that the correction coil assembly of the present invention provides a structure which is particularly useful in cryogenic environments. The structure provided exhibits a small radial extent so as to minimize the required volume of liquid coolant. The present invention is also seen to prevent relative motion between the coil forms so as to preserve design conditions. The present correction coil assembly also provides a large degree of contact between the correction coils and the cryogenic coolant. The present invention is also particularly advantageous in that it provides a means to align the entire correction coil assembly not only with respect to the various coil forms themselves, but also with respect to external and main magnet assemblies. Additionally, the present design permits simple assembly, disassembly and reassembly, if necessary, for accurate positioning of the forms with respect to one another. Furthermore, the structure of the present invention is particularly adapted for manufacture at room temperature conditions and for use at cryogenic temperatures without inducing undue amounts of thermal stress.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A correction coil assembly, especially for use in superconductive magnets and other cryogenic environments, said assembly comprising:
   at least one electrical coil disposed on a first cylindrical form;
   at least one transverse coil disposed on a second cylindrical coil form, said second form having a longitudinal slit therein, said second form being disposed coaxially about said first form and over said coil disposed on said first form;
   an insulated, non-magnetic wire having a coefficient of thermal expansion greater than that of the material of said second coil form, said wire being tightly wrapped around said second coil form so as to securely hold said second form against said first form under cryogenic conditions; and a pair of insulative supports diposed at and fixed to each end of said assembly, each end of said wire being attached to a distinct one of said supports.

2. The assembly of claim 1 further including:
at least one transverse coil disposed on a third cylindrical coil form, said third form having a longitudinal slit therein, said third coil form also being disposed coaxially between said first and second coil forms;
a flat, non-magnetic band, insulated from said coils on said third form, said band being wrapped around said third coil form so as to be disposed between said second and said third coil forms.

3. The assembly of claim 2 in which said band comprises aluminum.

4. The apparatus of claim 2 in which each end of said band is affixed to a distinct end of an underlying coil form.

5. The assembly of claim 4 in which said band is affixed by means of pins disposed through said slit in said second form.

6. The assembly of claim 2 in which said third coil form comprises glass, fiber and epoxy composite material.

7. The assembly of claim 1 wherein said wire comprises superconductive material.

8. The assembly of claim 1 in which said electrical coil on said first form and said transverse coils on said second form comprise superconductive material.

9. The assembly of claim 1 in which said first form comprises glass fiber and epoxy composite material.

10. The assembly of claim 1 in which said second form comprises glass, fiber and epoxy composite material.

11. The assembly of claim 1 in which said insulative supports comprise:
a T-shaped key member affixed to said first form with an end thereof extending into a mating notch in said second form so as to provide axial and circumferential alignment of said second form with respect to said first form;
an insulative bushing affixed to said key member for attachment of said wire.

12. The assembly of claim 11 in which said T-shaped key member comprises aluminum.

13. The assembly of claim 1 further including:
at least one transverse coil disposed on a third cylindrical coil form, said third form having a longitudinal slit therein, said third coil form being disposed coaxially between and first and second coil forms;
a flat, non-magnetic band, insulated from said coils on said third form, said band being wrapped around said third coil form so as to be disposed between said second coil form and said third coil form;
a T-shaped key member affixed to said first coil form with an end thereof extending into a mating notch in said second and third coil forms so as to provide axial and circumferential alignment of said second and third coil forms with respect to said first coil form; and
an insulative bushing affixed to said key member for attachment of said wire.

* * * * *